(12) United States Patent
Cheng et al.

(10) Patent No.: US 8,426,268 B2
(45) Date of Patent: Apr. 23, 2013

(54) EMBEDDED DRAM MEMORY CELL WITH ADDITIONAL PATTERNING LAYER FOR IMPROVED STRAP FORMATION

(75) Inventors: Kangguo Cheng, Guilderland, NY (US); David M. Dobuzinsky, East Meadow, NY (US); Byeong Y. Kim, Lagrangeville, NY (US); Munir D. Naeem, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 512 days.

(21) Appl. No.: 12/698,293

(22) Filed: Feb. 2, 2010

(65) Prior Publication Data

US 2010/0193852 A1 Aug. 5, 2010

Related U.S. Application Data

(60) Provisional application No. 61/149,525, filed on Feb. 3, 2009.

(51) Int. Cl.
*H01L 21/8242* (2006.01)
(52) U.S. Cl.
USPC ............. 438/243; 257/E21.008; 257/E21.613
(58) Field of Classification Search ........... 257/E21.008, 257/E21.613, E21.646, E21.647, E21.651, 257/E21.655, E21; 438/171, 210, 239, 243
See application file for complete search history.

(56) References Cited

U.S. PATENT DOCUMENTS

| | | | |
|---|---|---|---|
| 5,770,484 A | 6/1998 | Kleinhenz | |
| 6,350,653 B1 | 2/2002 | Adkisson et al. | |
| 6,376,286 B1 * | 4/2002 | Ju | 438/149 |
| 6,426,252 B1 | 7/2002 | Radens et al. | |
| 6,762,447 B1 * | 7/2004 | Mandelman et al. | 257/301 |
| 6,964,898 B1 * | 11/2005 | Cheng | 438/243 |
| 7,129,130 B2 | 10/2006 | Adkisson et al. | |
| 7,344,954 B2 * | 3/2008 | Yeh et al. | 438/386 |
| 7,569,451 B2 * | 8/2009 | Huang et al. | 438/243 |
| 7,741,188 B2 * | 6/2010 | Dyer et al. | 438/386 |
| 2007/0063244 A1 * | 3/2007 | Ho et al. | 257/301 |

\* cited by examiner

*Primary Examiner* — Eduardo A Rodela
(74) *Attorney, Agent, or Firm* — Scully, Scott, Murphy & Presser, P.C.; Joseph P. Abate, Esq.

(57) ABSTRACT

The present invention relates to semiconductor devices, and more particularly to a structure and method for forming memory cells in a semiconductor device using a patterning layer and etch sequence. The method includes forming trenches in a layered semiconductor structure, each trench having an inner sidewall adjacent a section of the layered semiconductor structure between the trenches and an outer sidewall opposite the inner sidewall. The trenches are filled with polysilicon and the patterning layer is formed over the layered semiconductor structure. An opening is then patterned through the patterning layer, the opening exposing the section of the layered semiconductor structure between the trenches and only a vertical portion of the polysilicon along the inner sidewall of each trench. The layered semiconductor structure is then etched. The patterning layer prevents a second vertical portion of the polysilicon along the outer sidewall of each trench from being removed. By adding the patterning layer over the semiconductor structure during trench type memory cell fabrication, strap resistance and its variation can be reduced, resulting in better DRAM cell operation with less process dependence and improved strap overlay formation.

8 Claims, 8 Drawing Sheets

EMBEDDED DRAM MEMORY CELL WITH ADDITIONAL PATTERNING LAYER FOR IMPROVED STRAP FORMATION

This non-provisional application claims the benefit of the provisional application filed with the United States Patent and Trademark Office as Ser. No. 61/149,525 entitled "Embedded Dram Memory Cell With Additional Patterning Layer For Improved Strap Formation", filed Feb. 3, 2009.

FIELD OF THE INVENTION

The present invention relates to semiconductor devices, and more particularly, to a structure and method for forming memory cells in a semiconductor device using a patterning layer and etch sequence.

BACKGROUND OF THE INVENTION

Dynamic Random Access Memory (DRAM) cells are well known. A DRAM cell is essentially a capacitor for storing charge and a pass transistor (also called a pass gate or access transistor) for transferring charge to and from the capacitor. Data stored in the cell is determined by the absence or presence of charge on the storage capacitor. Because cell size affects chip density and cost, reducing cell area is one of the DRAM designer's primary goals.

One way to accomplish this density goal without sacrificing storage capacitance is to use trench capacitors in the cells. Trench capacitors can be formed by etching deep trenches in a semiconductor wafer and forming vertically orientated capacitors within each deep trench. Thus, the surface area required for the storage capacitor is dramatically reduced without sacrificing capacitance, and correspondingly, storable charge. In order to further decrease the density of the device, the access transistor can also be positioned in a vertical orientation, as opposed to a planar orientation.

Trench type memory cells have a connection between the trench filled polysilicon electrode and the source/drain (S/D) of an access transistor, commonly known as a strap. The strap resistance is determined by process control rather than design. One key process step occurs during dry etching of trenched polysilicon. Because it is difficult to control the end point mechanism of the process, a problem exists with the polysilicon etch rate variation between wafers, lots and tools. This causes varying strap resistance levels, which is a key problem for trench type memory fabrication.

Therefore, what is needed in the art is a structure and method which provides a more uniform etch profile to regulate strap resistance.

SUMMARY OF THE INVENTION

The present invention relates to semiconductor devices, and more particularly to a structure and method for forming memory cells in a semiconductor device using a patterning layer and etch sequence. The method includes forming the patterning layer over polysilicon filled trenches in a layered semiconductor structure and patterning an opening through the patterning layer to expose a section of the layered semiconductor structure between the trenches and only a vertical portion of the polysilicon along an inner sidewall of each trench. The patterning layer is patterned to prevent a second vertical portion of the polysilicon along the outer sidewall of each trench from being removed.

Specifically, and in broad terms, a method is disclosed for forming a memory cell in a semiconductor device, the method comprising:
forming trenches in a layered semiconductor structure, each trench having an inner sidewall adjacent a section of the layered semiconductor structure between the trenches and an outer sidewall opposite the inner sidewall;
filling the trenches with polysilicon;
forming a patterning layer over the layered semiconductor structure;
patterning an opening through the patterning layer over the trenches, the opening exposing the section of the layered semiconductor structure between the trenches and only a vertical portion of the polysilicon along the inner sidewall of each trench; and
etching the layered semiconductor structure.

In a related aspect, the patterning prevents a second vertical portion of the polysilicon along the outer sidewall of each trench from being exposed.

In a related aspect, the layered semiconductor structure comprises:
a buried insulating layer over a bulk layer;
a semiconductor-on-insulator (SOI) layer over the buried insulating; and
a dielectric layer over the SOI layer.

In a related aspect, etching the trenches and the layered semiconductor comprises:
performing a first vertical reactive ion etch (RIE) process to remove the dielectric layer between the trenches; and
performing a second vertical RIE process to remove the SOI layer between the trenches and only the vertical portion of the polysilicon along the inner sidewall of each trench.

In a related aspect, the second vertical RIE process removes the vertical portion of the polysilicon along the inner sidewall of each trench to a point in the buried insulating layer.

In a related aspect, the second vertical RIE process removes the vertical portion of the polysilicon along the inner sidewall of each trench to a point in the SOI layer.

In a related aspect, the method further comprises forming a pad oxide layer over the polysilicon in the trenches prior to the formation of the patterning layer.

In a related aspect, filling the trenches with polysilicon comprises one of filling the trenches with polysilicon to a point in the dielectric layer and filling the trenches with polysilicon to a point in the SOI layer.

In a related aspect, the second vertical portion of the polysilicon remains along the outer sidewall after the second vertical RIE process.

In a related aspect, the method further comprises:
forming a shallow trench isolation (STI) fill material over the polysilicon in the trenches after the trenches are etched;
forming a set of field effect transistors over the layered semiconductor structure; and
forming a silicide strap over the layered semiconductor structure.

Another aspect of the present invention relates to a method of forming an embedded dynamic random access memory (eDRAM) having at least one trench capacitor memory cell, the method comprising:
forming polysilicon filled trenches in a layered semiconductor structure, each trench having an inner sidewall adjacent a section of the layered semiconductor structure between the trenches and an outer sidewall opposite the inner sidewall;
forming a patterning layer over the layered semiconductor structure;

patterning an opening through the patterning layer over the trenches, the opening exposing the section of the layered semiconductor structure between the trenches and only a vertical portion of the polysilicon along the inner sidewall of each trench; and etching the layered semiconductor structure without substantially removing a second vertical portion of the polysilicon along the outer sidewall.

In a related aspect, the second vertical RIE process removes the vertical portion of the polysilicon along the inner sidewall of each trench to a point in one of the buried insulating layer and the SOI layer.

Another aspect of the present invention relates to an embedded dynamic random access memory (eDRAM) device, comprising:
a layered semiconductor structure, including:
a buried insulating layer over a bulk layer;
a semiconductor-on-insulator (SOI) layer over the buried insulating layer; and
a dielectric layer over the SOI layer; and
a set of trenches located in the layered semiconductor structure, each trench including:
an inner sidewall adjacent a section of the layered semiconductor structure between the trenches, the inner sidewall having a vertical portion of polysilicon extending only partially along the inner sidewall of each trench; and
an outer sidewall opposite the inner sidewall, the outer sidewall having a second vertical portion of polysilicon extending along an entire depth of the outer sidewall.

In a related aspect, the semiconductor device further comprises a pad oxide layer over a top surface of the second vertical portion of polysilicon.

In a related aspect, the vertical portion of polysilicon extends partially along the inner sidewall of each trench to a point in the buried insulating layer.

In a related aspect, the vertical portion of polysilicon extends partially along the inner sidewall of each trench to a point in the SOI layer.

In a related aspect, the second vertical portion of polysilicon extends to a top surface of the SOI layer.

Another aspect of the invention relates to a design structure embodied in a machine readable medium for designing, manufacturing, or testing an integrated circuit, the design structure comprising:
a layered semiconductor structure, including:
a buried insulating layer over a bulk layer;
a semiconductor-on-insulator (SOI) layer over the buried insulating layer; and
a dielectric layer over the SOI layer;
a set of trenches located in the layered semiconductor structure, each trench including:
an inner sidewall adjacent a section of the layered semiconductor structure between the trenches, the inner sidewall having a vertical portion of polysilicon extending only partially along the inner sidewall of each trench; and
an outer sidewall opposite the inner sidewall, the outer sidewall having a second vertical portion of polysilicon extending along an entire depth of the outer sidewall.

DETAILED DESCRIPTION OF THE INVENTION

The present invention, which provides a structure and a method for forming memory cells in a semiconductor device, will now be described in greater detail by referring to the drawings that accompany the present application. It is noted that the drawings of the present application are provided for illustrative purposes and are thus not drawn to scale. Moreover, like and corresponding elements shown in the drawings are referred to by like reference numerals.

Reference is first made to FIGS. 1-4, which are cross sectional views of a semiconductor device 100 during various stages of an embodiment of the present invention. Although the drawings show the presence of a pair of trenches, the present invention is not limited to that number of trenches. Instead, the present integration process works for any number of trenches. Furthermore, although the exemplary embodiment describes an eDRAM semiconductor device, the present invention is also applicable to DRAM, SRAM and any other type of semiconductor device that requires DRAM cells within the device or as a standalone.

Figure 1:
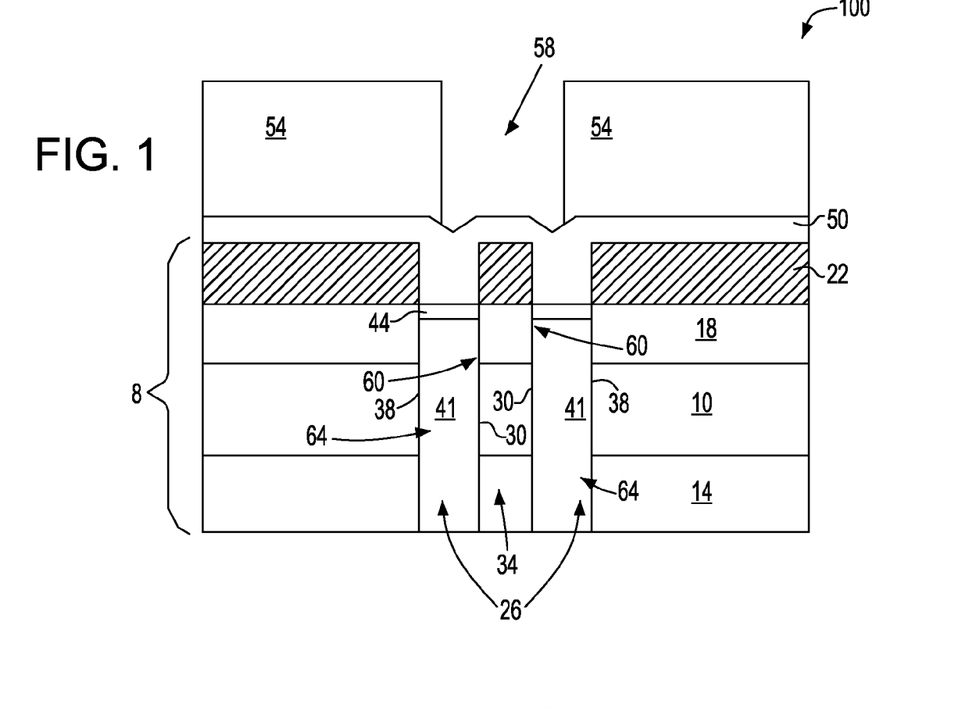
FIGS. 1-4 are pictorial representations (through cross sectional views) illustrating the basic processing steps employed for forming memory cells in a semiconductor device according to an embodiment of the present invention.

FIG. 1 shows an initial semiconductor device and memory cell (hereinafter "device") 100 according to an embodiment of the invention. Specifically, the initial device 100 shown in FIG. 1 comprises a layered semiconductor structure 8, including a buried insulating layer 10 located over a bulk layer 14, a semiconductor-on-insulator (SOI) layer 18 located over the buried insulating layer 10, and a dielectric layer 22 located over the SOI layer 18. The device 100 further comprises a set of polysilicon-filled trenches 26 formed in the layered semiconductor structure 8. Each trench 26 includes an inner sidewall 30 adjacent a section 34 of the layered semiconductor structure 8 between the trenches 26 and an outer sidewall 38 opposite the inner sidewall 30.

The SOI layer 18 is typically, but not necessarily, always limited to a silicon (Si)-containing layer having a thickness ranging from approximately 20 nm to 100 nm. Illustrative examples of various Si semiconductor materials that can be employed in the present invention include, but are not limited to: Si, SiGe, SiGeC, SiC and other like Si-containing materials. Combinations of the aforementioned semiconductor materials can also be used as the SOI layer 18 of the layered semiconductor structure 8.

The SOI layer 18 is doped to provide suitable electrical conductivity for a conduction path from subsequently formed bitlines (not shown) to subsequently formed memory devices. Preferably, the SOI layer 18 is doped to provide $n^+$ type silicon. Conventional processes, such as ion implantation, may introduce the dopant. Alternatively, the SOI layer 18 can be in-situ doped. In one embodiment, a photoresist block mask may be formed to selectively implant various regions of the device 100, while a remaining portion of the substrate underlying the photoresist block mask is protected.

The buried insulating layer 10 of substrate 8 may comprise a crystalline or non-crystalline oxide, nitride or combinations thereof. Preferably, the buried insulating layer 10 is a buried oxide (BOX).

The dielectric layer 22 is formed atop the SOI layer 18. The dielectric layer 22 is deposited by chemical vapor deposition (CVD) and related deposition methods and can comprise nitride, oxide, or oxynitride materials. Following deposition, the dielectric layer 22 is patterned to provide an etch mask for the subsequently formed trenches 26 using photolithography and an etch process.

Trenches 26 are then formed in the layered semiconductor structure 8 using an etch process. The etch process may be selected from the group comprising of, but not limited to: reactive ion etch (RIE), ion-beam etching, plasma etching or any other like dry etch process. The trenches 26 provide the areas within the device, in which storage capacitors and transistors are formed. In one embodiment, the trenches 26 may be formed by multiple processing steps, including but not limited to, etching, substrate doping and capacitor dielectric formation. As is known in the art, substrate doping can be done by thermal drive-in with a solid source (e.g., arsenic silicate glass) on the appropriate portion of the trench sidewall surface. The arsenic silicate glass layer can be removed with a wet etch process. Alternatively, plasma doping or gas phase using a dopant gas (e.g., $AsH_3$) in hydrogen ambient can be used as well.

As is known in the art, the capacitor dielectric can be formed in several ways. For example, the capacitor dielectric can be oxynitride formed by CVD nitride deposition and nitridation, or a high k dielectric deposition (e.g., $Ta_2O_5$, $HfO_2$, etc.) with appropriate thermal annealing processes. It can be appreciated that certain process steps have been omitted for the sake of clarity and brevity. For example, although not specifically shown, the capacitor fabrication process may include spacer formation on the side well of the trenches in the SOI region to protect dopant diffusion, as well as a trench bottom process to enlarge the trench capacitor surface area. It can be appreciated that these processes might result in minor differences to the simplified drawings without departing from the spirit or scope of the present invention.

Figure 5:
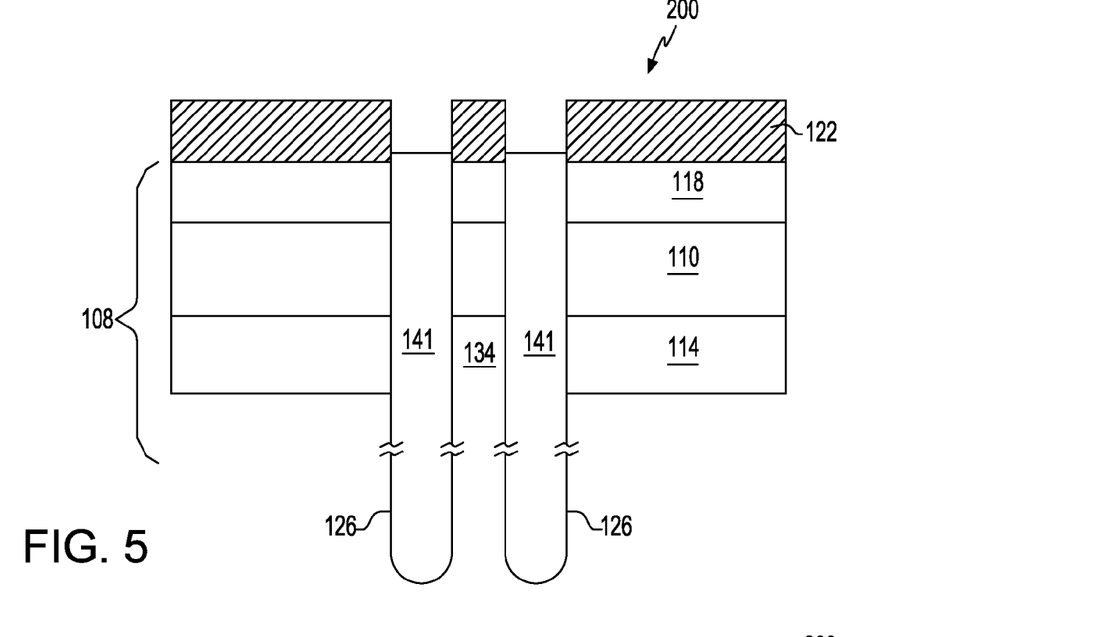
FIGS. 5-9 are pictorial representations (through cross sectional views) illustrating the basic processing steps employed for forming memory cells in a semiconductor device according to another embodiment of the present invention.

As shown in FIG. 1, the trenches 26 are then filled with polysilicon 41. The polysilicon 41 is typically doped with arsenic and deposited using deposition processes well known in the art including, but not limited to: chemical vapor deposition (CVD), low pressure CVD (LPCVD), and high-density chemical vapor deposition (HDCVD). Following deposition, the polysilicon is then recessed using a dry etch process. In one embodiment, the trenches 26 are filled with the polysilicon 41 and are etched to a point in the dielectric layer 122 (as shown in FIG. 5). However, in another embodiment, the trenches 26 may be filled and etched to a point in the SOI layer 18.

Next, as shown in the embodiment of FIG. 1, an optional oxide layer 44 may be formed over the polysilicon 41 in the trenches 26, for example by thermal oxidation of the polysilicon 41 or by low pressure chemical vapor deposition (LPCVD). The thickness of the oxide layer 44 may range from about 5 nm to about 15 nm.

A patterning layer 50 is then formed over the layered semiconductor structure 8. In an exemplary embodiment shown in FIG. 1, the patterning layer 50 consists of polysilicon and is formed on the dielectric layer 22 utilizing a known deposition process such as, for example, physical vapor deposition, CVD or evaporation. The thickness of the patterning layer 50 is typically from about 20 nm to about 50 nm. As will be further explained below, when the patterning layer 50 and the SOI layer 18 are etched together, the etch loading effect can be eliminated or reduced, resulting in a more uniform etch profile.

Following formation of the patterning layer 50, a photoresist block mask 54 is formed over the patterning layer 50 to pattern an opening 58 through the patterning layer 50 over the trenches 26. The opening 58 exposes the section 34 of the layered semiconductor structure 8 between the trenches 26 and only a vertical portion 60 of the polysilicon 41 along the inner sidewall 30 of each trench 26. The location of the opening 58 and the patterning of the photoresist block mask 54 prevent a second vertical portion 64 of the polysilicon 41 along the outer sidewall 38 of each trench 26 from being exposed and subsequently etched.

Figure 2:
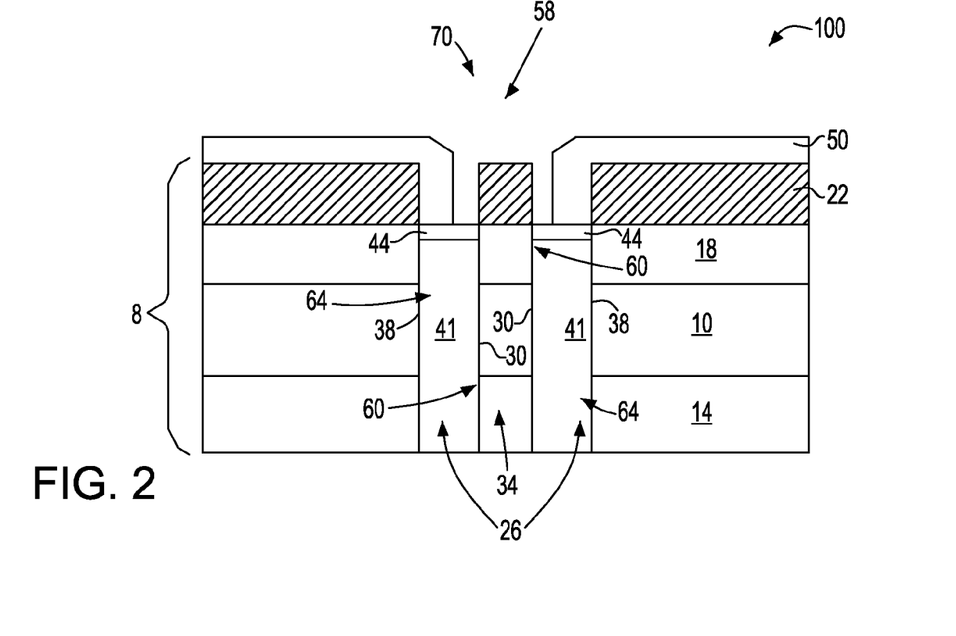
Figure 3:
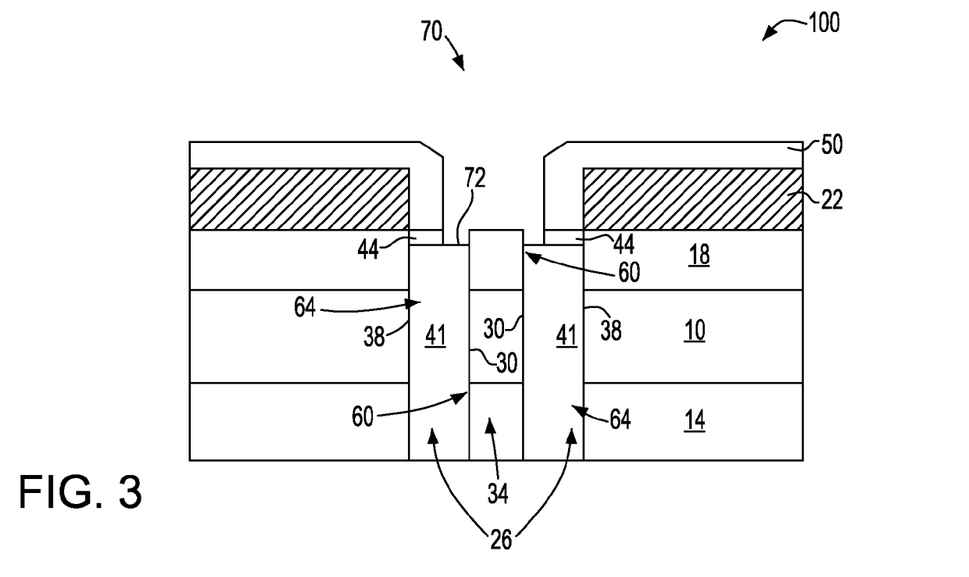
Figure 4:
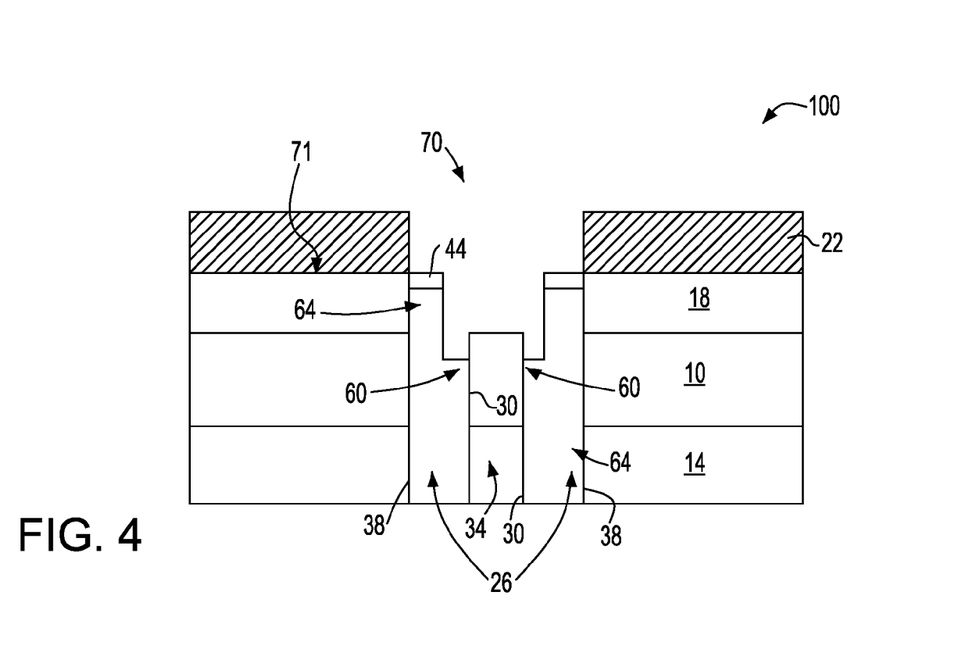

Next, referring to FIGS. 2-4, a shallow trench isolation (STI) region 70 is formed in the device 100. The STI region 70 is formed by etching the trenches 26 and the section 34 of the layered semiconductor structure 8 between the trenches 26 exposed by the opening 58. First, as shown in FIG. 2, the photoresist block mask 54 is stripped following the patterning layer 50 being etched selective to the oxide layer 44. Suitable dry etching processes that can be used in the present invention for removing the patterning layer 50 include, but are not limited to: reactive ion etching, ion beam etching, plasma etching or laser ablation. The dry etching process employed in this step is selective to the oxide layer 44 and therefore does not typically remove the polysilicon 41 from the trenches 26.

As shown in FIG. 3, etching the trenches 26 and the layered semiconductor structure 8 further includes performing a first vertical RIE process to remove the dielectric layer 22 between the trenches 26. In the exemplary embodiment of FIG. 3, the first vertical RIE process is selective to a top surface 72 of the polysilicon 41 in the trenches 26, and removes a portion of the oxide layer 44 not covered by the patterning layer 50.

Next, as shown in FIG. 4, a second vertical RIE process is performed to remove the SOI layer 18 between the trenches 26 and only the vertical portion 60 of the polysilicon 41 along the inner sidewall 30 of each trench 26 to a point in the buried insulating layer 10. The vertical portion 60 extends only partially along the inner sidewall 30 of each trench 26, while the second vertical portion 64 of the polysilicon 41 extends along an entire depth of the outer sidewall 38. The second vertical portion 64 of the polysilicon 41 remains along the outer sidewall 38 after the second vertical RIE process. Furthermore, a section of the oxide layer 44 remains over a top surface 73 of the second vertical portion 64 of the polysilicon 41 along the outer sidewall 38. As shown, the oxide layer 44 extends to a top surface 71 of the SOI layer 18.

During the second vertical RIE process, the SOI layer 18 and the patterning layer 50 are etched together, thus reducing the etch loading effect and reduces pattern dependent etch variation as well. The plasma used in the RIE process is exposed to only one element (Si), regardless of whether it's the STI region 70 or an active region. This allows all etch by-products to be consistent, regardless of pattern density.

Although not shown, in another embodiment, the first and second vertical RIE processes can be combined. The patterning layer 50 and the SOI layer 18 are removed simultaneously, wherein the thickness of the patterning layer 50 is less than the thickness of the SOI layer 18. The final recess depth into the polysilicon 41 can be controlled with SOI over-etching.

Figure 6:
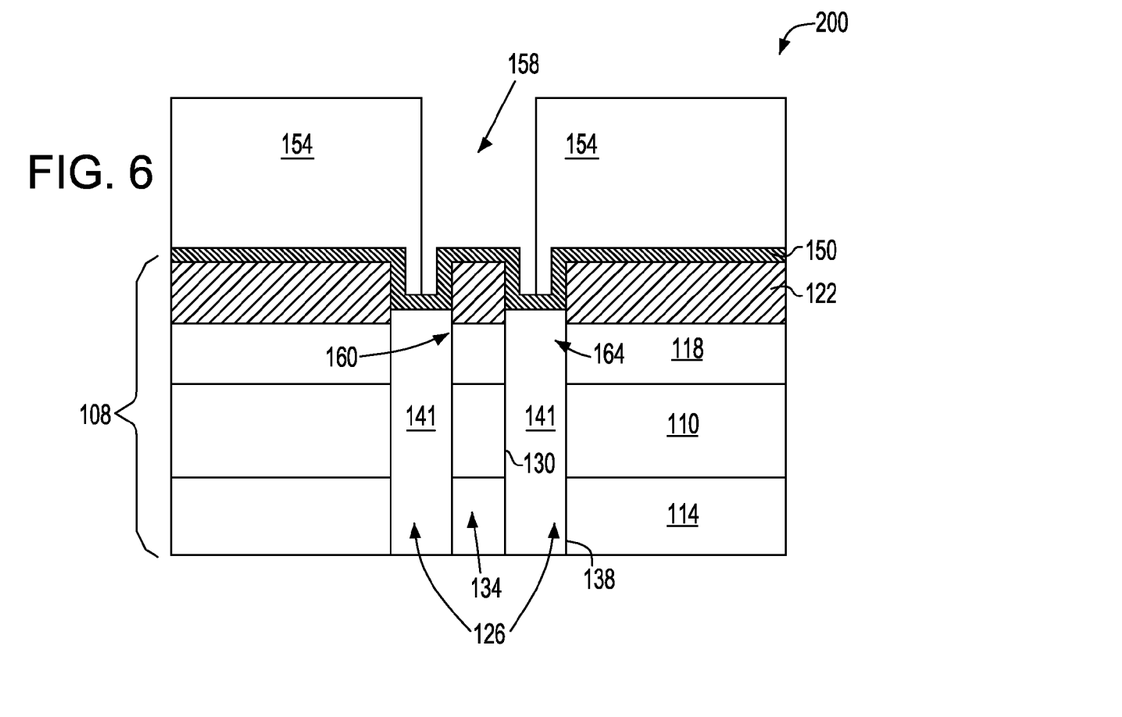

Reference is now made to FIGS. 5-8, which are cross sectional views of the semiconductor device 200 during various stages of another embodiment of the present invention. A complete description of features in common with the embodiment shown in FIGS. 1-4 will be dispensed with for the sake of brevity. First, as shown in FIG. 5, the trenches 126 are filled with polysilicon 141 to a point in the dielectric layer 122. FIG. 6 shows the polysilicon patterning layer 150 formed over the dielectric layer 122 and the polysilicon 141 in the trenches 126. A photoresist block mask 154 is subsequently formed over the patterning layer 150 to pattern an opening 158 through the patterning layer 150 over the trenches 126.

Figure 7:
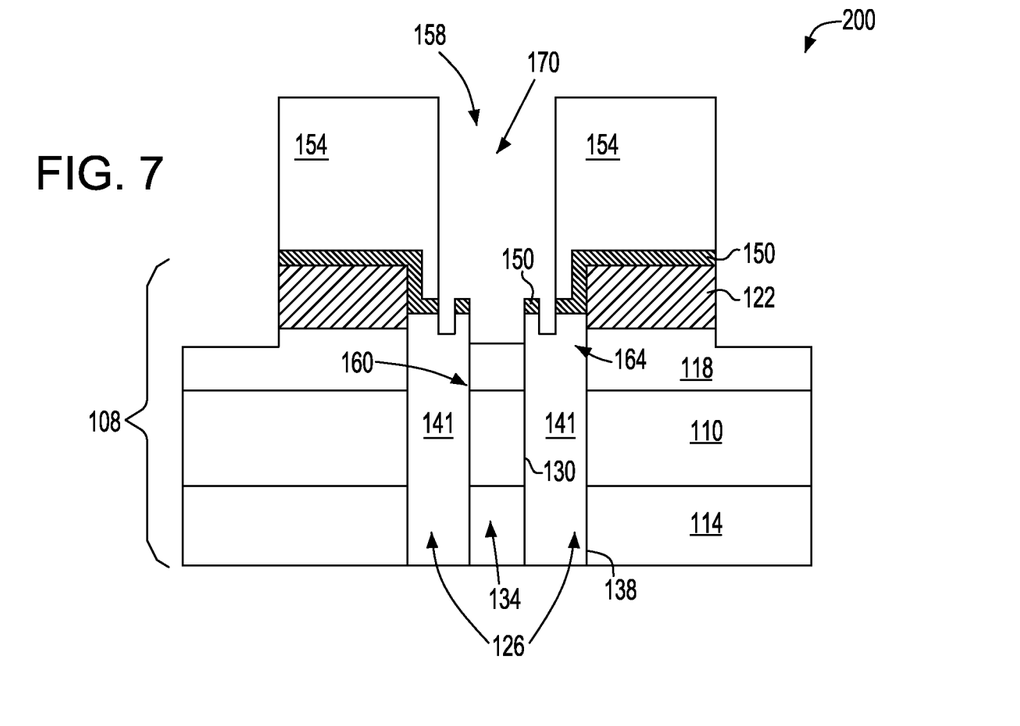

Next, as shown in FIG. 7, the STI region 170 is formed by etching the trenches 126 and the section 134 of the layered semiconductor structure 108 exposed by the opening 158. Etching the trenches 126 and the section 134 of the layered semiconductor structure 108 includes performing a first vertical RIE process to remove the dielectric layer 122 between the trenches 126. In the exemplary embodiment of FIG. 7, the first vertical RIE process comprises a first polysilicon etch to remove the polysilicon patterning layer 150 over the dielectric layer 122, followed by a nitride etch to remove the dielectric layer 122 and portions of the polysilicon 141 in the trenches 126.

Figure 8:
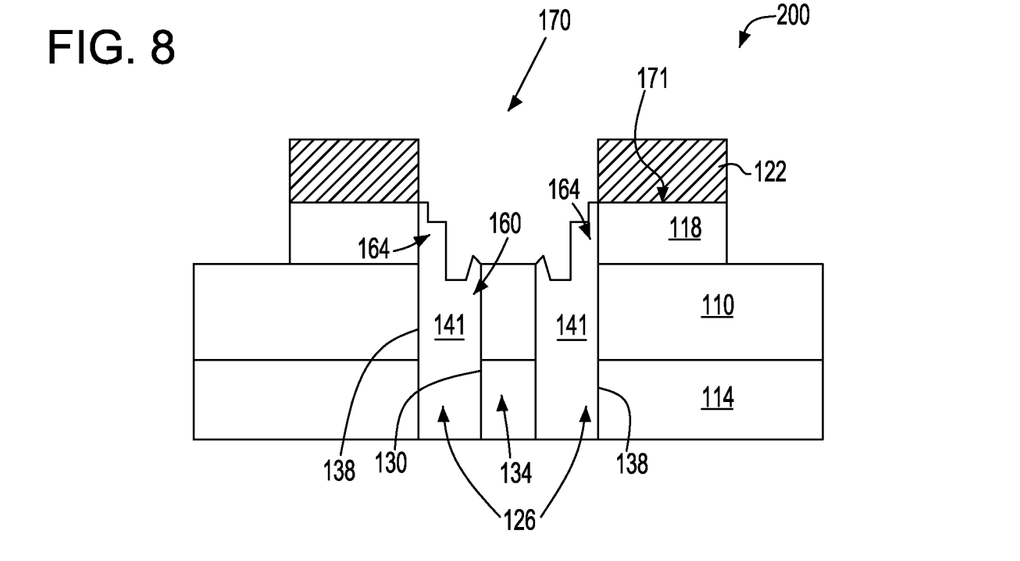

Next, as shown in FIG. 8, a second vertical RIE process is performed to remove the patterning layer 150, the SOI layer 118, and only the vertical portion 160 of the polysilicon 141 along the inner sidewall 130 of each trench 126 to the bottom of the SOI layer 118. The vertical portion 160 of the polysilicon 141 extends only partially along the inner sidewall 130 of each trench 126, while the second vertical portion 164 of the polysilicon 141 extends along an entire depth of the outer sidewall 138. The second vertical portion 164 extends to a top surface 171 of the SOI layer 118 and remains along the outer sidewall 138 following the second vertical RIE process. In the embodiment shown in FIG. 8, the second vertical portion 164 of the polysilicon 141 forms a self aligned, step-like conductor ring so that the passing word line (not shown) can have enough distance and a portion of a silicide strap connection (shown in FIG. 8) can be extended to the surface of the SOI layer 118. The second vertical portion 164 of the polysilicon 141 may extend up to the surface of the SOI layer 118 since this does not effect overlay variation between the trenches 126 and the polysilicon 141.

The amount and geometry of the second vertical portion 164 is determined by the combination of the original thickness of patterning layer 150, the location of the photo resist block mask 154, the initial fill level of the polysilicon 41 (FIG. 5), and the amount of material removed during the second RIE process. The amount of material removed during the second RIE process may be equal to the thickness/depth of the SOI layer 118, including some over etching, since a portion of the SOI layer 18 is etched during the first RIE process.

Figure 9:
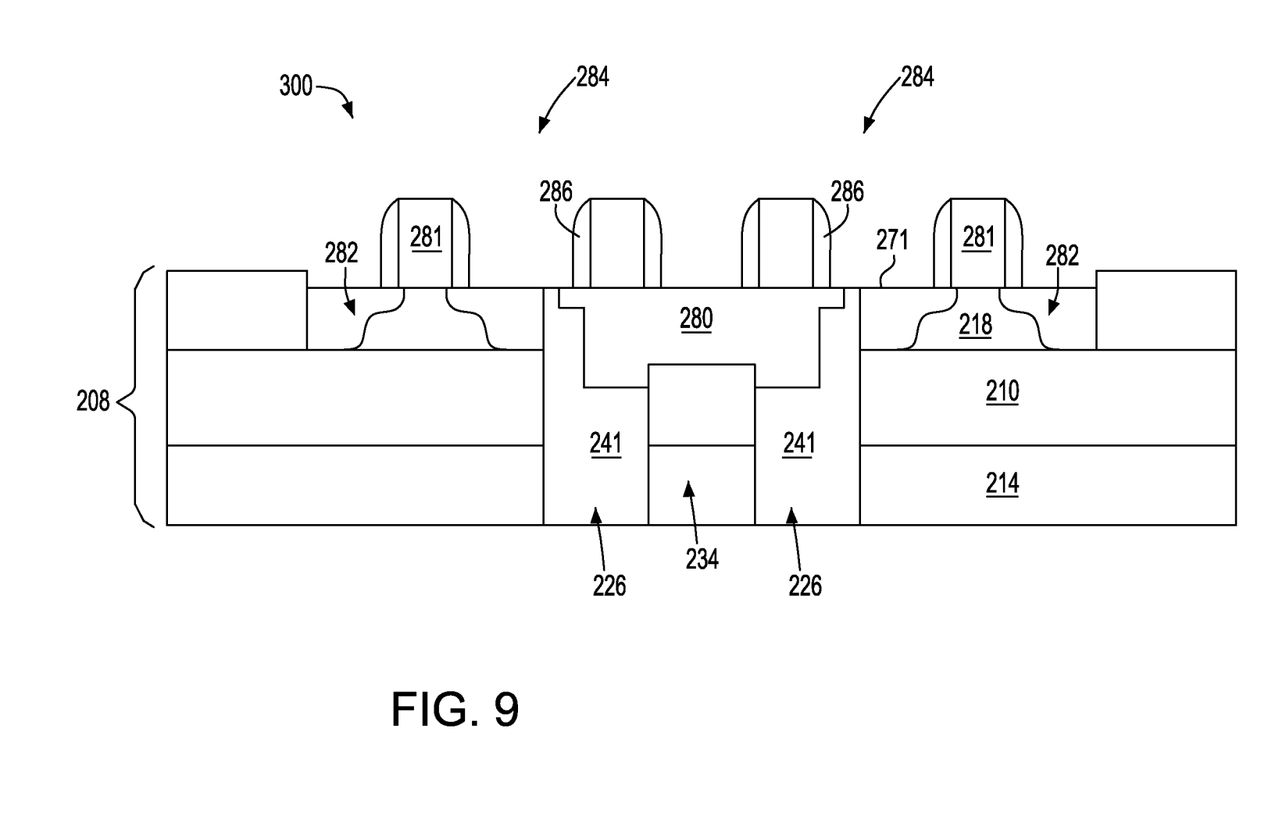

Next, as shown in FIG. 9, logic devices may be formed over the layer semiconductor structure 208. In a first step, a shallow trench isolation (STI) fill material 280 is formed over the polysilicon 241 in the trenches 226 and the section 234 of the layered semiconductor structure 208 between the trenches 226. The STI fill material 280 is typically an oxide that is planarized to the surface of the substrate SOI layer 218.

Next, a set of field effect transistors (FETs) 284 is formed over the layered semiconductor structure 208. Well implants, gate oxidation, gate conductors 281 and source/drain regions 282 are formed, as is commonly known. Portions of the oxide layer 244 not covered by spacers 286 of the FETs 284 are then stripped to expose the underlying polysilicon 241 in the trenches 226.

Figure 10:
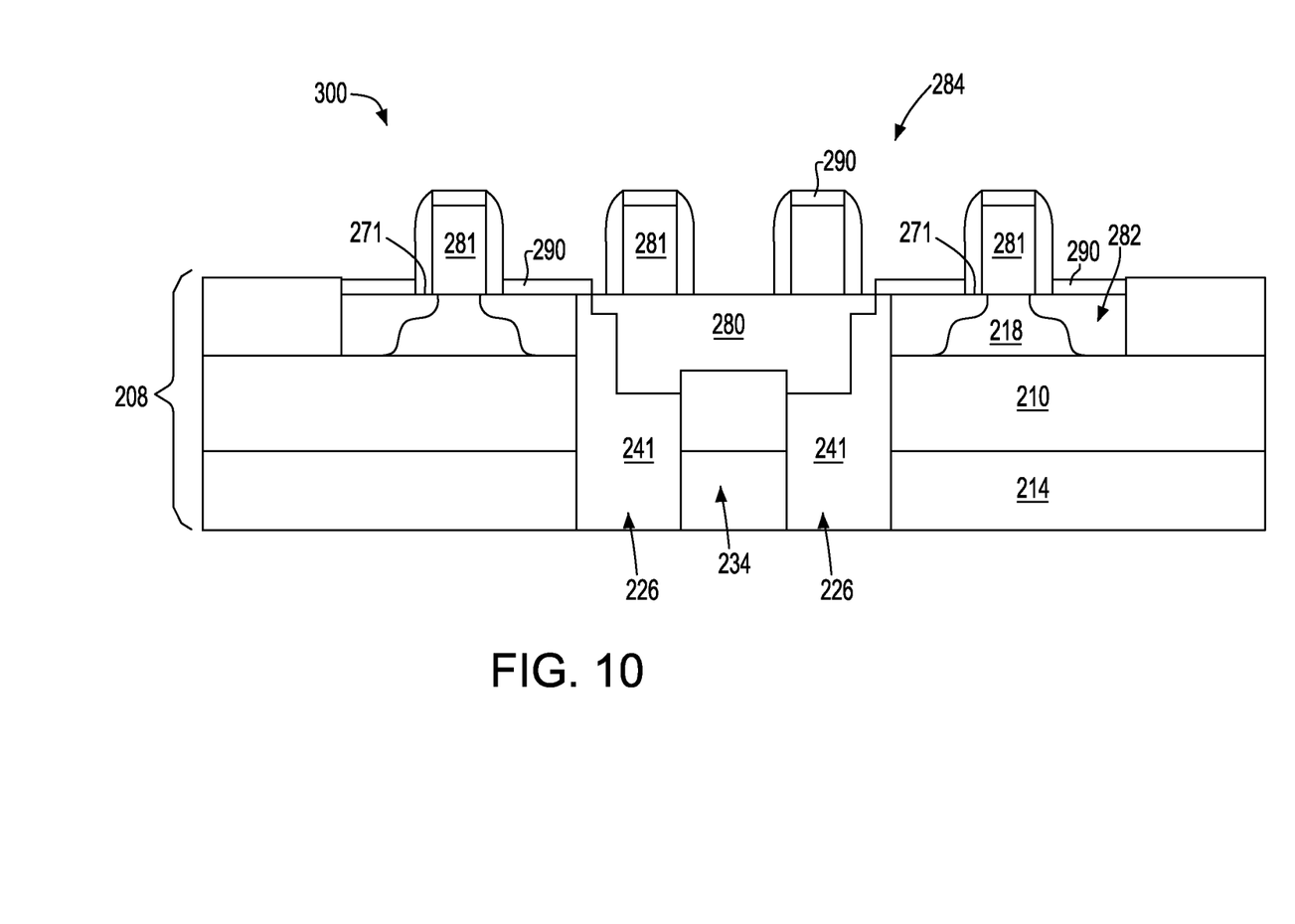
FIG. 10 is a pictorial representation (through a cross sectional view) illustrating the basic structure resulting from the processing steps shown in FIGS. 5-9, as well as an additional silicide strap formed over the layered semiconductor structure, according to the present invention.

As shown in FIG. 10, silicide straps 290 may then be formed over the gate conductor 281 and the source/drain regions 282. The silicide straps 290 are formed selectively on exposed silicon and polysilicon regions by deposition of metal (W) and subsequent diffusion of the metal into silicon with a thermal process (i.e., a silicidation process). Unreacted metal on insulator region are removed selectively to the silicide. In the embodiment shown in FIG. 10, the second vertical portion 264 of the polysilicon 241 extends to the top surface 271 of SOI layer 218. Unlike conventional structures having an uneven step between the top of the SOI layer and the polysilicon, the second vertical portion 264 is aligned to the top surface 271 of the SOI layer 218, resulting in a better connection with the silicide straps 290.

Figure 11A:
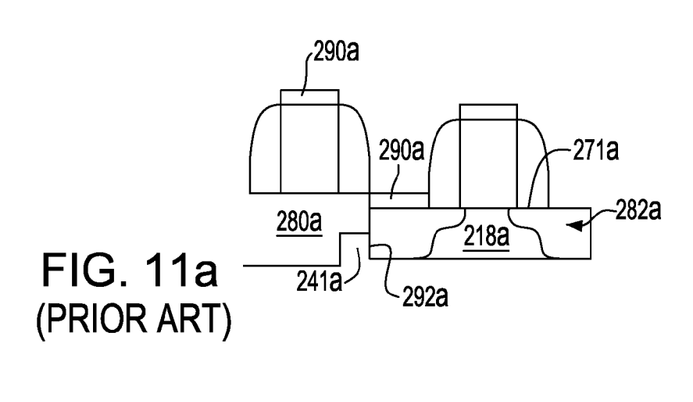
FIG. 11a is a pictorial representation (through a cross sectional view) illustrating a portion of a prior art memory cell device.
Figure 11B:
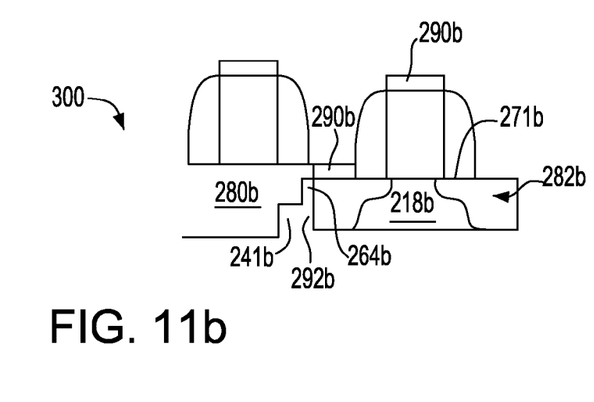
FIG. 11b is a pictorial representation (through a cross sectional view) illustrating a portion of the basic structure resulting from the processing steps shown in FIGS. 5-9, according to the present invention.

As is known in the art, the resistance of the silicide straps in DRAM memory cells is influenced by the amount of polysilicon in contact with the SOI layer. For example, in a conventional prior art device, as shown in FIG. 11a, the polysilicon 241a extends partially along the trench to a point in the SOI layer 218a. The length of the interface 292a is approximately equal to one-half of the thickness/depth of the SOI layer 218a, resulting in a higher strap resistance. However, in the embodiment of the present invention shown in FIG. 11b, the length of the interface 292b is approximately equal to the entire thickness/depth of the SOI layer 218b. The second vertical portion 264b of the polysilicon 241b extends to the top surface 271b of the SOI layer 218b. Increasing the contact between the polysilicon 241b and the SOI layer 218 reduces the strap resistance and improves the overall performance of the device 300.

Figure 12A:
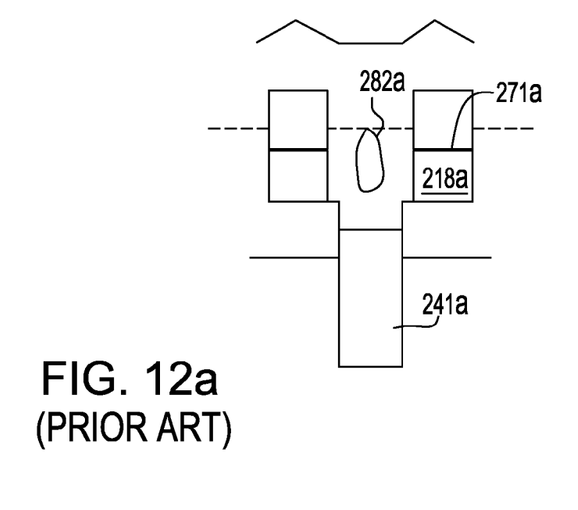
FIG. 12a is a pictorial representation (through a cross sectional view) illustrating the location of a void in a portion of a prior art memory cell device.
Figure 12B:
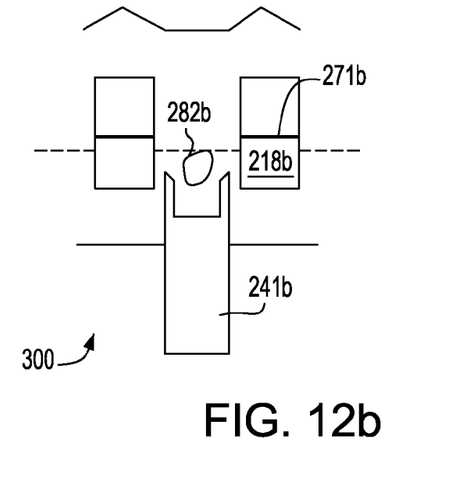
FIG. 12b is a pictorial representation (through a cross sectional view) illustrating the location of a void in a portion of the basic structure resulting from the processing steps shown in FIGS. 5-9, according to the present invention.

Referring now to FIGS. 12a-12b, another advantage of the present invention will be described in further detail. With the embodiment shown in FIGS. 7-8, voids created during formation of the STI region are positioned lower in the device. As shown in FIG. 12a, conventional prior art etching processes cause the void 282a to be positioned above the top surface 271a of the SOI layer 218a. During etching, the void 282a is more likely to be exposed, thus causing an electrical short between adjacent lines during subsequent processing steps. However, as shown in FIG. 12b, the present invention causes the void 282b to be buried below the top surface 271. The void 282b is more likely to remain covered by the STI fill material 280, thus eliminating the possibility of device malfunction.

Although not shown for the sake of brevity, a conventional CMOS fabrication process can be subsequently performed to complete the CMOS device, as is well known in the art.

Figure 13:
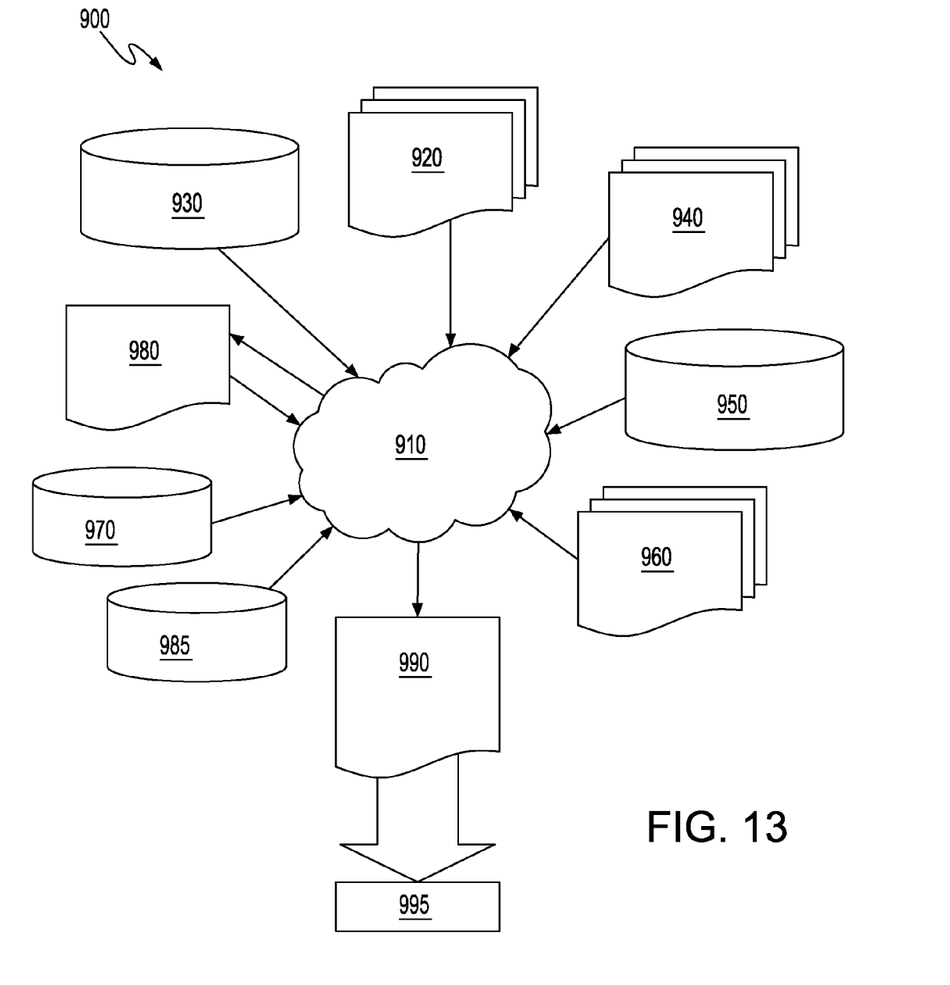
FIG. 13 is a flow diagram of a design process used in semiconductor designing, manufacturing and/or testing.

FIG. 13 shows a block diagram of an example design flow 900. Design flow 900 may vary depending on the type of IC being designed. For example, a design flow 900 for building an application specific IC (ASIC) may differ from a design flow 900 for designating a standard component. Design structure 920 is preferably an input to a design process 910 and may come from an IP provider, core developer, or other design company, or may be generated by the operator of the design flow, or from other sources. Design structure 920 comprises ICs 100, 200, 300 (FIGS. 1-10) and in the form of schematics or HDL, a hardware-description language (e.g., Verilog, VHDL, C, etc.). Design structure 920 may be a text file or a graphical representation of ICs 100, 200, 300. Design process 910 preferably synthesizes (or translates) ICs 100, 200, 300 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations for a given manufacturing technology (e.g., different technology nodes, 32 nm, 45 nm, 90 nm, etc.), design specifications 940, characterization data 950, verification data 960, design specifications 970, and test data files 985 (which may include test patterns and other testing information). Design process 910 may further include, for example, standard circuit design processes such as timing analysis, verification, design rule checking, place and route operations, etc. One of ordinary skill in the art of IC design can appreciate the extent of possible electronic design automation tools and applications used in design process 910 without deviating from the scope and spirit of the invention. The design structure of the invention is not limited to any specific design flow.

Design process 910 preferably translates embodiments of the invention, as shown in FIGS. 1-10, along with any additional integrated circuit design or data into a second design structure 990. Design structure 990 resides on a storage medium in a data format used for the exchange of layout data of integrated circuits (e.g., information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention, as shown in FIGS. 1-10. Design structure 990 may then proceed to a stage 995 where, for example, design structure 990: proceeds to tape-out, is released to manufacturing, is released to a mask house, is sent to another design house, is sent back to the customer, etc.

While the present invention has been particularly shown and described with respect to preferred embodiments thereof, it will be understood by one skilled in the art that the foregoing and other changes in forms and details may be made without departing from the spirit and scope of the invention. It is therefore intended that the present invention is not limited to the exact forms and details described and illustrated, but falls within the spirit and scope of the appended claims.

What we claim is:

1. A method of forming a memory cell in a semiconductor device, comprising:
    forming trenches in a layered semiconductor structure, each trench having an inner sidewall adjacent a section of the layered semiconductor structure between the trenches and an outer sidewall opposite the inner sidewall, wherein the layered semiconductor structure comprises a buried insulating layer over a bulk layer, a semiconductor-on-insulator (SOI) layer over the buried insulating layer, and a dielectric layer over the SOI layer;
    filling the trenches with polysilicon;
    forming a patterning layer over the layered semiconductor structure;
    patterning an opening through the patterning layer, the opening exposing the section of the layered semiconductor structure between the trenches and only a vertical portion of the polysilicon along the inner sidewall of each trench; and
    etching the trenches and layered semiconductor structure, wherein said etching the trenches and the layered semiconductor structure comprises:
        performing a first vertical reactive ion etch (RIE) process to remove the dielectric layer between the trenches; and
        performing a second vertical RIE process to remove the patterning layer, the SOI layer between the trenches, and only the vertical portion of the polysilicon along the inner sidewall of each trench.

2. The method of claim 1, wherein the patterning prevents a second vertical portion of the polysilicon along the outer sidewall of each trench from being removed.

3. The method of claim 1, wherein the second vertical RIE process removes the vertical portion of the polysilicon along the inner sidewall of each trench to a point in one of the buried insulating layer and the SOI layer.

4. The method of claim 1, further comprising forming a pad oxide layer over the polysilicon in the trenches prior to the formation of the patterning layer.

5. The method of claim 1, wherein filling the trenches with polysilicon comprises one of filling the trenches with polysilicon to a point in the dielectric layer and filling the trenches with polysilicon to a point in the SOI layer.

6. The method of claim 1, wherein the patterning layer is a polysilicon patterning layer.

7. The method of claim 1, wherein the second vertical portion of the polysilicon remains along the outer sidewall after the second vertical RIE process, the second vertical portion of the polysilicon extending to a top surface of the SOI layer.

8. The method of claim 1, further comprising:
    forming a shallow trench isolation (STI) fill material over the polysilicon in the trenches after the trenches are etched;
    forming a set of field effect transistors over the layered semiconductor structure; and
    forming a silicide strap over the layered semiconductor device.

* * * * *